United States Patent
Kim

(10) Patent No.: US 9,470,757 B2
(45) Date of Patent: Oct. 18, 2016

(54) CHANNEL CONTROL CIRCUIT AND SEMICONDUCTOR DEVICE HAVING THE SAME

(71) Applicant: SK hynix Inc., Icheon-si Gyeonggi-do (KR)

(72) Inventor: Ki Tae Kim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/929,546

(22) Filed: Nov. 2, 2015

(65) Prior Publication Data

US 2016/0069956 A1   Mar. 10, 2016

Related U.S. Application Data

(63) Continuation of application No. 13/845,254, filed on Mar. 18, 2013, now Pat. No. 9,207,281.

(30) Foreign Application Priority Data

Dec. 21, 2012 (KR) ................ 10-2012-0150158

(51) Int. Cl.
*G01R 31/28* (2006.01)
*G01R 31/3177* (2006.01)
*G01R 31/3185* (2006.01)

(52) U.S. Cl.
CPC ... *G01R 31/3177* (2013.01); *G01R 31/318552* (2013.01)

(58) Field of Classification Search
CPC ......... G01R 1/25; G01R 11/25; G01R 31/00
USPC ............... 714/724, 725, 726, 729, 731, 734
See application file for complete search history.

(56) References Cited

U.S. PATENT DOCUMENTS 9,207,281 B2 * 12/2015 Kim ................ G01R 31/31855
2012/0272112 A1 * 10/2012 Oh ..................... H01L 23/481
714/727

* cited by examiner

*Primary Examiner* — Minh D A
(74) *Attorney, Agent, or Firm* — William Park & Associates, Ltd.

(57) ABSTRACT

A channel control circuit having a plurality of channels according to an embodiment of the present invention includes: a channel control signal generating block configured to generate a channel control signal capable of selectively controlling an activated state of a channel in response to a combination of a first test mode signal and a second test mode signal; a scan buffer control signal generating block configured to generate a scan buffer control signal in response to the first test mode signal and a scan signal; a clock buffer control signal generating block configured to generate a clock buffer control signal in response to the channel control signal and the scan buffer control signal; and a clock input buffer configured to generate a clock output signal, which is used as an internal clock of a semiconductor device, in response to the clock buffer control signal.

9 Claims, 4 Drawing Sheets

CHANNEL CONTROL CIRCUIT AND SEMICONDUCTOR DEVICE HAVING THE SAME

CROSS-REFERENCES TO RELATED APPLICATION

The present application is a Continuation of U.S. application Ser. No. 13/845,254, filed on Mar. 18, 2013, and the present application claims priority under 35 U.S.C. §119(a) to Korean application number 10-2012-0150158, filed on Dec. 21, 2012, in the Korean Intellectual Property Office, which is incorporated herein by reference in its entirety.

BACKGROUND

1. Technical Field

Various embodiments generally relate to a semiconductor device, and more particularly to a semiconductor device having high test efficiency.

2. Related Art

The demand for high-speed, multi-functional and miniaturized semiconductor device continues to grow. A chip scale package is a part of the efforts to develop such a semiconductor device. For example, a System on Chip (SoC) is an integrated circuit that integrates various components of an electronic system into a single chip. In the System on Chip, a plurality of bump pads can be disposed.

FIG. 1 is a schematic block diagram illustrating a known SoC having a wide-IO DRAM.

Referring to FIG. 1, an SoC 1 includes four channels ch A, ch B, ch C, and ch D.

Each of the channels includes four banks BK0, BK1, BK2, and BK3.

Each channel includes a peripheral region PERI thereof, and the peripheral regions PERIs include the respective clock buffers 10a, 10b, 10c, and 10d therein. The channels ch A, ch B, ch C, and ch D include the respective bump pad groups a, b, c, and d to transmit and receive signals to and from an external system. The respective bump pad groups a, b, c, and d, include bump pads provided for clock, address, command, DQ, and power.

In addition, a semiconductor device may have pads PAD for probe test on the center column thereof.

In order for a system provider to estimate the characteristics of a DRAM itself, a mode of applying an input directly to the DRAM, without passing through a system, is required. In order to test memory cells in the banks of each channel, a direct access (hereinafter, referred to as "DA") mode test method is used. In the DA mode, since a function test needs to be performed with a minimum number of bump pads, input signals are transmitted to and received from all channels in common.

FIG. 1 illustrates a case where the respective clock buffers 10a, 10b, 10c, and 10d are coupled to one bump pad for clock in common, in a DA mode. A signal applied to one bump pad is applied to the respective corresponding channel signal units in common.

However, it is impossible in a DA mode to perform a boundary test, which is performed to check defects in bump pads, on each channel individually. In addition, since signals of all channels are applied in common, it is impossible to control electrical fuses of each channel individually. Moreover, it is impossible in a DA mode to measure the amount of current by channel, which is required in the Wide IO JEDEC Standard.

SUMMARY

A semiconductor device having improved test efficiency by enabling a test freely from a structural connection for providing a DA mode in the DA mode is described herein.

In an embodiment of the present invention, a channel control circuit of a semiconductor device includes: a channel control signal generating block configured to generate a channel control signal capable of selectively controlling an activated state of a channel in response to a combination of a first test mode signal and a second test mode signal; a scan buffer control signal generating block configured to generate a scan buffer control signal in response to the first test mode signal, a first scan signal, and a second scan signal; a clock buffer control signal generating block configured to generate a clock buffer control signal which controls whether to activate a clock input buffer in response to the channel control signal and the scan buffer control signal; and the clock input buffer configured to generate a clock output signal in response to a clock signal and the clock buffer control signal.

In an embodiment of the present invention, a channel control circuit of a semiconductor device is included in each of a plurality of channels, and is configured to be able to control only one predetermined channel to be selected and activated and the remaining channels to be at an inactivated state, in a DA mode for simultaneously testing the plurality of channels of the semiconductor device which includes the plurality of channels.

According to an embodiment of the present invention, while a structural connection is formed to receive the same signal in order to operate in a DA mode, it is possible to transition from the synchronous channel mode to a mode of independently operating one channel properly using test mode signals. Accordingly, various tests can be performed according to each channel, thereby being able to improve test efficiency.

BRIEF DESCRIPTION OF THE DRAWINGS

Features, aspects, and embodiments are described in conjunction with the attached drawings, in which.

DETAILED DESCRIPTION

Hereinafter, a channel control circuit of a semiconductor device having improved test efficiency in a DA mode according to various embodiments of the present invention will be described below with reference to the accompanying drawings through exemplary embodiments.

Figure 1:
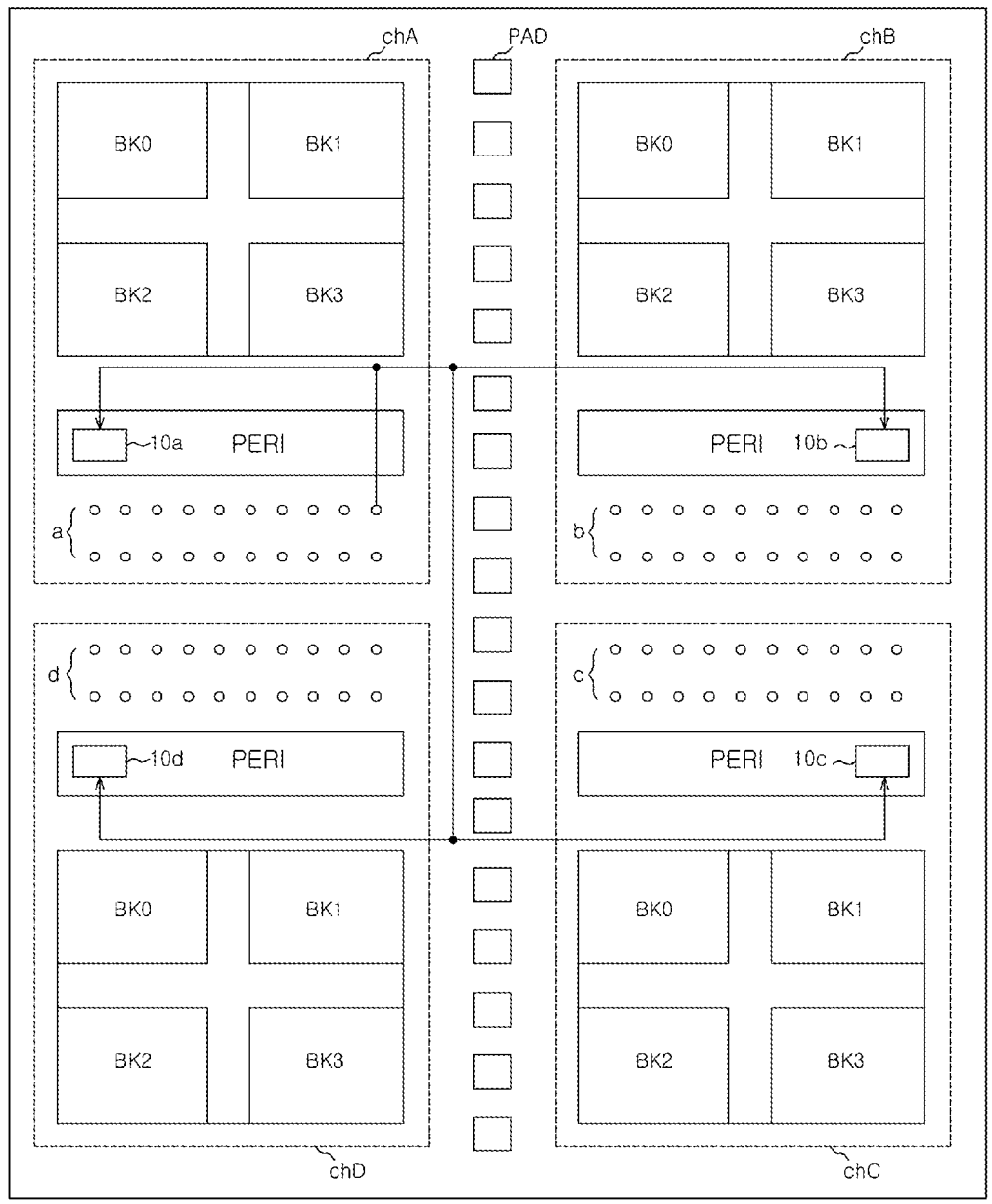
FIG. 1 is a schematic block diagram of a channel control circuit of a known semiconductor device.
Figure 2:
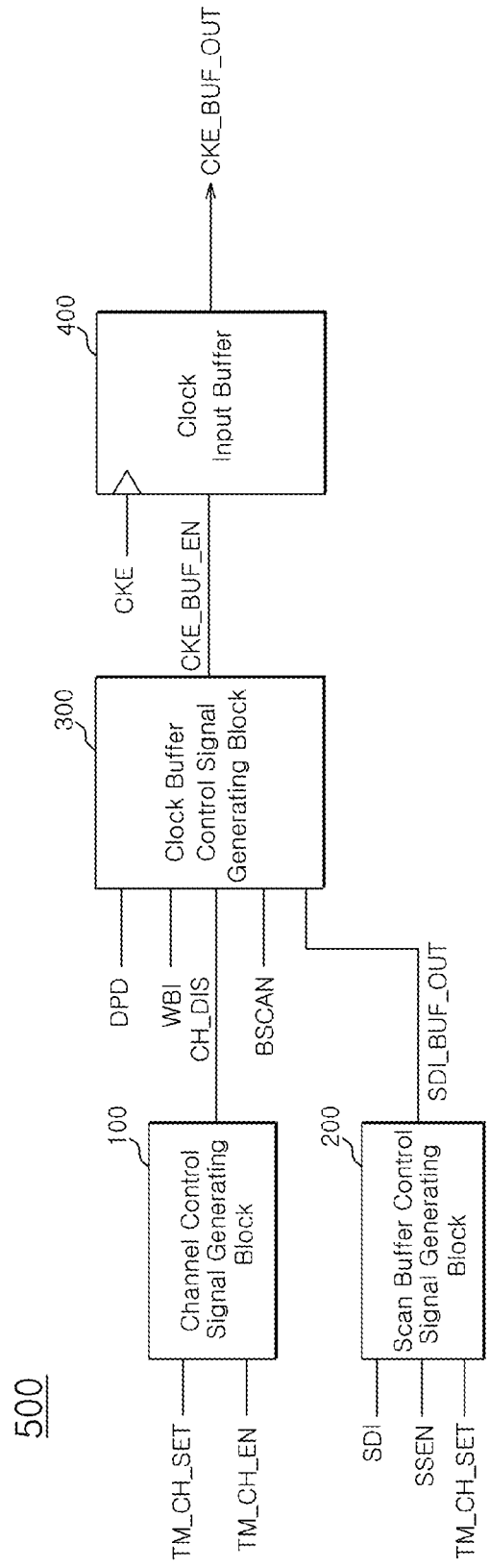
FIG. 2 is a block diagram of a semiconductor device according to an embodiment of the present invention.

FIG. 2 is a block diagram of a channel control circuit of a semiconductor device according to an embodiment of the present invention.

Referring to FIG. 2, a channel control circuit 500 includes a channel control signal generating block 100, a scan buffer control signal generating block 200, a clock buffer control signal generating block 300, and a clock input buffer 400. Although it is not shown, the channel control circuit 500 is regarded as a circuit unit configured in each channel. In an embodiment of the present invention, the number of channels is, for example, four. Here, the number of channels may correspond to the number of Wide IO DRAMs (e.g., four) in an SoC-type chip.

The channel control signal generating block 100 generates a channel control signal CH_DIS in response to a first test mode signal TM_CH_SET and a second test mode signal TM_CH_EN. The first test to mode signal TM_CH_SET is a signal to enter a test mode. In addition, the second test mode signal TM_CH_EN is a toggle signal, and can selectively activate a channel according to the number of times of toggle. Therefore, in a test mode, the channel control signal generating block 100 can activate a clock input buffer of a corresponding channel according to the number of times of toggle of the second test mode signal TM_CH_EN. Each channel may have the channel control signal generating block 100 therein. Channel control signal CH_DIS may deactivate a corresponding channel for a predetermined time period.

The scan buffer control signal generating block 200 generates a scan buffer control signal SDI_BUF_OUT in response to the first test mode signal TM-CH-SET, a first scan signal SDI, and a second scan signal SSEN. Here, the first scan signal SDI is an input signal for performing a boundary scan test which is performed to check defects in bump pads, and the second scan signal SSEN is a boundary scan test enable signal. The first and second scan signals SDI and SSEN are used not as a signal for controlling a boundary scan test mode, but as a signal of a remainder bump pad unused in a DA mode. For example, the first and second scan signals SDI and SSEN may be used to perform the following circuit control. Therefore, although an embodiment of the present invention is described as to an example where a signal for boundary scan test mode is used, it is not excluded that another signal not applied in common in a DA mode can be used. Similarly, since the scan buffer control signal SDI_BUF_OUT used for a scan buffer is generated in response to the first and second scan signals SDI and SSEN, another signal, unused in a DA mode, capable of enabling the following circuit may be used instead of the scan buffer control signal SDI_BUF_OUT. The scan buffer control signal generating block 200 may control the level of the scan buffer control signal SDI_BUF_OUT in response to the first test mode signal TM-CH-SET or the first scan signal SDI. The scan buffer control signal generating block 200 may control the following circuit to activate, for example, only the corresponding channel in response to the first test mode signal TM-CH-SET, or to exit from a first channel test mode using the first scan signal SDI after the corresponding channel has been tested. This will be discussed in detail hereinafter with reference to the drawings.

The clock buffer control signal generating block 300 generates a clock buffer control signal CKE_BUF_EN in response to the channel control signal CH_DIS, the scan buffer control signal SDI-_BUF_OUT, a boundary scan test mode signal BSCAN, a wafer burn-in signal WBI, and a deep power down mode signal DPD. The clock buffer control signal generating block 300 deactivates the clock buffer control signal CKE_BUF_EN of a corresponding clock input buffer in response to the channel control signal CH_DIS. Each channel may have the clock buffer control signal generating block 300 therein. Accordingly, the corresponding channel may be deactivated state for a predetermined time period in response to an activated channel control signal CH_DIS of the clock buffer control signal generating block 300. The corresponding channel may be activated in response to the scan buffer control signal SDI_BUF_OUT. A detailed description thereof will be given hereinafter with reference to the drawings.

The clock input buffer 400 generates a clock output signal CKE_BUF_OUT in response to a clock signal CKE and the clock buffer control signal CKE_BUF_EN. The clock output signal may be used as an internal clock of the semiconductor device. The clock input buffer 400 may generate an internal clock in response to an activated clock buffer control signal CKE_BUF_EN and a clock signal CKE received from an exterior. When the clock buffer control signal CKE_BUF_EN is deactivated, The clock input buffer 400 may not generate an internal clock. Each channel may have the clock input buffer 400 therein.

As described above, according to an embodiment of the present invention, when the channel control signal CH_DIS is used, it is possible to activate a 1-channel operation mode, not a 4-channel operation mode, even in a DA mode. Also, it is possible to activate only a corresponding channel desired to be activated by the second test mode signal TM_CH_EN, and to activate a channel control signal CH_DIS, thereby deactivating the remaining clock input buffers.

As described in an embodiment of the present invention, it is possible to individually test a corresponding channel by activating the clock input buffer 400 of the corresponding channel.

Figure 3:
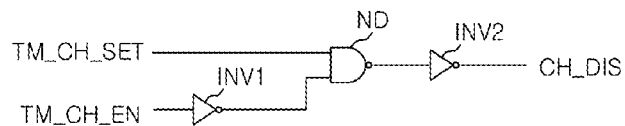
FIG. 3 is a circuit diagram of a channel control signal generating block capable of being implemented in the block diagram of FIG. 2.

FIG. 3 is a circuit diagram of a channel control signal generating block 100 capable of being implemented in FIG. 2.

Referring to FIG. 3, the channel control signal generating block 100 includes a first inverter INV1, a NAND gate ND, and a second inverter INV2.

The NAND gate ND performs a NAND operation on a first test mode signal TM_CH_SET and an inverted second test mode signal TM_CH_EN. The second inverter INV2 inverts an output signal of the NAND gate ND and output a channel control signal CH_DIS. Each channel may have a channel control signal generating block 100 therein.

Therefore, for example, when the second test mode signal TM_CH_EN of a first channel (not shown) is at a low level, and the first test mode signal TM_CH_SET thereof is at a high level, the channel control signal CH_DIS of the first channel is at a high level which means deactivation of a channel.

When the second test mode signal TM_CH_EN and first test mode signal TM_CH_SET of a first channel (not shown) are at a high level, the channel control signal CH_DIS of the first channel is at a low level which means activation of a channel.

Since the second test mode signal TM_CH_EN is a pulse-type signal, i.e. a toggle signal, it is possible to change a selected channel according to the number of times of input of the second test mode signal TM_CH_EN.

For example, a first channel (not shown) can be selected when the second test mode signal TM_CH_EN is input one time, and a second channel (not shown) can be selected when the second test mode signal TM_CH_EN is input two times.

In an embodiment of the present invention, the first test mode signal TM_CH_SET which is maintained at the activated level for relatively long time as compared to the second test mode signal TM_CH_EN is applied to all channels in common.

Therefore, it is possible to control the selection and operations of a channel in response to a combination of the first test mode signal TM_CH_SET and the second test mode signal TM_CH_EN.

Figure 4:
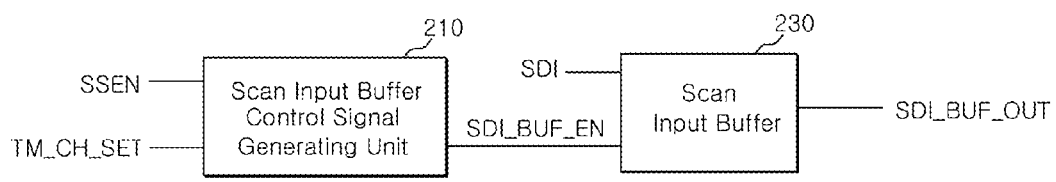
FIG. 4 is a block diagram of a scan buffer control signal generating block capable of being implemented in the block diagram of FIG. 2.

FIG. 4 is a block diagram of a scan buffer control signal generating block 200 capable of being implemented in FIG. 2.

Referring to FIG. 4, the scan buffer control signal generating block 200 includes a scan input buffer control signal generating unit 210 and a scan input buffer 230.

The scan input buffer control signal generating unit 210 generates a scan input buffer control signal SDI_BUF_EN in response to the second scan signal SSEN and the first test mode signal TM-CH-SET.

The scan input buffer control signal generating unit 210 supplies an activated scan input buffer control signal SDI_BUF_EN when any one of the second scan signal SSEN and first test mode signal TM-CH-SET is activated. In other words, so as to be used in both normal mode and DA mode, the scan input buffer control signal generating unit 210 is configured to supply a scan input buffer control signal SDI-BUF-EN activated by activation of any one of the second scan signal SSEN and first test mode signal TM-CH-SET.

The scan input buffer 230 generates a scan buffer control signal SDI_BUF_OUT in response to a first scan signal SDI and the scan input buffer control signal SDI_BUF_EN.

When the scan input buffer control signal SDI_BUF_EN is activated, the scan input buffer 230 generates a scan buffer control signal SDI_BUF_OUT the level of which changes depending on the level of the first scan signal SDI. For example, the scan input buffer 230 generates an activated scan buffer control signal SDI_BUF_OUT when the first scan signal SDI is activated.

Here, the second scan signal SSEN is a signal required to activate the scan input buffer 230. In an embodiment of the present invention, the first scan signal SDI may be an enable signal for controlling whether or not to activate a next-stage circuit.

As described above, the first and second scan signals SDI and SSEN are signals used to control a following circuit, not signals for boundary scan test mode control. Therefore, other signals can be used to generate an enable signal for controlling whether or not to activate a next-stage circuit.

Where the clock input buffer (see reference number 400 of FIG. 2) of a corresponding channel is deactivated, when the 1-channel test mode ends, the clock input buffers (see reference number 400 of FIG. 2) of the corresponding channel are activated again by an activated scan buffer control signal SDI_BUF_OUT of the scan buffer control signal generating block 200 included in each channel, thereby being able to return to the original DA mode.

Figure 5:
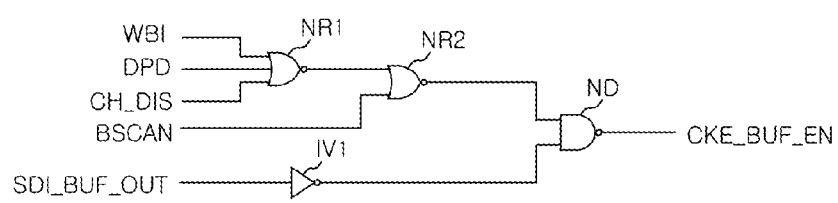
FIG. 5 is a circuit diagram of a clock buffer control signal generating block capable of being implemented in the block diagram of FIG. 2.

FIG. 5 is a circuit diagram of a clock buffer control signal generating block 300 capable of being implemented in FIG. 2.

Referring to FIG. 5, the clock buffer control signal generating block 300 includes a first NOR gate, a second NOR gate NR2, an inverter IV, and a NAND gate ND.

The first NOR gate NR1 performs a NOR combination of a channel control signal CH_DIS, a wafer burn-in signal WBI, and a deep power down mode signal DPD.

The second NOR gate NR2 performs a NOR operation on an output of the first NOR gate NR1 and a boundary scan test mode signal BSCAN.

The inverter IV generates the opposite logic-level to a scan buffer control signal SDI_BUF_OUT.

The NAND gate ND performs a NAND operation on the output of the second NOR gate NR2 and the output of the inverter IV.

The operation of the clock buffer control signal generating block 300 is as follows: for example, when a channel control signal CH_DIS is at an activated level, e.g., a high level, the output of the first NOR gate NR1 is at a low level. In a DA mode, the boundary scan test mode signal BSCAN is at a low level, and thus the output of the second NOR gate NR2 is at a high level. In this case, the scan buffer control signal SDI_BUF_OUT varies depending on the level of the first scan signal SDI in FIG. 4. While a first scan signal SDI is being supplied at a low level, the scan buffer control signal SDI_BUF_OUT is at a low level. Therefore, the NAND gate ND receives the outputs of the second NOR gate NR2 and inverter IV, both of which are at a high level, and outputs a clock buffer control signal CKE_BUF_EN of a low level. In other words, when the channel control signal CH_DIS is activated and the scan buffer control signal SDI_BUF_OUT is deactivated, the clock buffer control signal generating block 300 outputs an deactivated clock buffer control signal CKE_BUF_EN. A following clock input buffer (see reference number 400 of FIG. 2) is deactivated in response to the deactivated clock buffer control signal CKE_BUF_EN. That is to say, a corresponding channel receiving a clock buffer control signal CKE_BUF_EN of a low level transitions to an deactivated state.

However, at the moment when the first scan signal SDI of FIG. 4 transitions to a high level, the scan buffer control signal SDI_BUF_OUT transitions to a high level. Accordingly, the NAND gate ND having received a low level allows the clock buffer control signal CKE_BUF_EN to be supplied at a high level, i.e. as an activation level.

Although the clock buffer control signal CKE_BUF_EN is controlled to be at a low level in response to the channel control signal CH_DIS, the clock buffer control signal CKE_BUF_EN can be controlled to be at a high level in response to the first scan signal SDI of FIG. 4 or the scan buffer control signal SDI_BUF_OUT.

During an operation in a DA mode, when it is necessary to test only one channel, not all channels, an deactivated clock buffer control signal CKE_BUF_EN is applied to the remaining channels using the channel control signal CH_DIS so as to deactivate the clock input buffers thereof (see reference number 400 of FIG. 2). In an embodiment of the present invention, when the test of the one channel is completed after a predetermined time period elapses, the corresponding clock input buffers (see reference number 400 of FIG. 2) can be activated by changing the deactivated clock buffer control signal CKE_BUF_EN to a high level.

Figure 6:
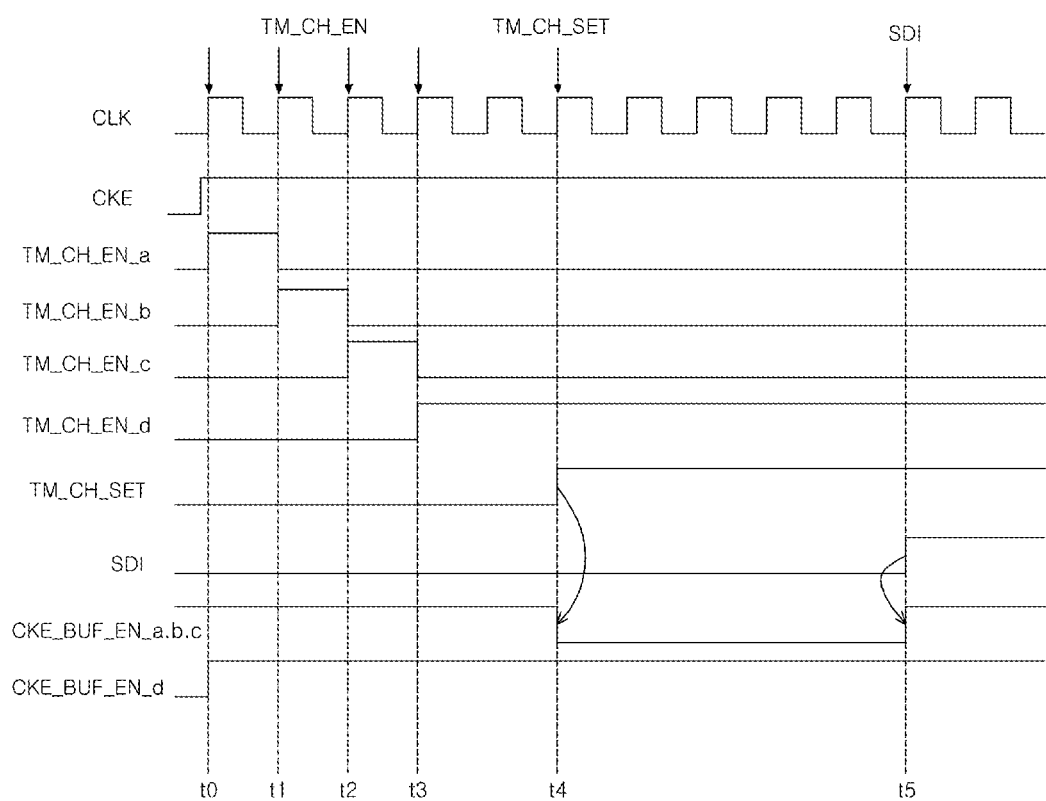
FIG. 6 is a timing diagram illustrating the operation of a channel control circuit capable of being implemented in the block diagram of FIG. 2.

FIG. 6 is a timing diagram illustrating the operation of a channel control circuit capable of being implemented in FIG. 2.

Here, channels will be divided into four channels, e.g., a, b, c, and d, for convenience of description.

A case where, while an operation is being performed in a DA mode, channel d is selected and a mode is changed to a 1-channel mode to perform a test will be described as an example.

First, in order to select channel d, the second test mode signal TM_CH_EN is applied four times during the period from time t0 to time t3.

In order to control the clock buffer control signals CKE_BUF_EN of the remaining channels, except for channel d, to be at a low level, a first test mode signal TM_CH_SET is applied at time t4. When an activated first test mode signal TM_CH_SET and the level of the second test mode signal TM_CH_EN at time t4 are combined (see reference number 100 of FIG. 3), the channel control signals CH_DIS of channels a, b, and c are all activated, and thus the clock buffer control signals CKE_BUF_EN-a, CKE_BUF_EN_b, and CKE_BUF_EN_c of channels a, b, and c, respectively, transition to a low level (see reference number 300 of FIG. 5). Accordingly, the clock input buffers of channels a, b, and c are all deactivated. Only channel d is activated, thereby being able to make an attempt to perform a desired test. For example, it is possible to perform a basic function test, or to measure the amount of current.

When a predetermined test has been completed, the scan input signal SDI is activated at time t5. As a result, the clock buffer control signals CKE_BUF_EN_a, CKE_BUF_EN_b, and CKE_BUF_EN_c, which have been deactivated for a predetermined time period, can be controlled to a high level in response to the first scan signal SDI or the scan buffer control signal SDI_BUF_OUT of FIG. 4.

Accordingly, it is possible to exit from the 1-channel mode, in which only channel d is activated, and to return to the DA mode in which four channels are activated at the same time.

As described above, according to an embodiment of the present invention, while a connection is formed to receive the same signal in order to operate in a DA mode, it is possible to transition from the synchronous channel mode to a mode of independently operating one channel by using test mode signals. Accordingly, various tests can be performed according to each channel, thereby being able to improve test efficiency.

While certain embodiments have been described above, it will be understood to those skilled in the art that the embodiments described are by way of example only. Accordingly, the circuit described herein should not be limited based on the described embodiments. Rather, the circuit described herein should only be limited in light of the claims that follow when taken in conjunction with the above description and accompanying drawings.

What is claimed is:

1. A semiconductor device, comprising:
   a plurality of channels; and
   pads shared by the plurality of channels,
   wherein, the plurality of channels are configured to be selectively inputted a clock signal in response to test mode signals for a test operation in a Direct Access mode for simultaneously testing the plurality of channels using the pads.

2. The semiconductor device according to claim 1, wherein, one of the pads is connected to clock buffers of the plurality of channels in common.

3. The semiconductor device according to claim 1, wherein a corresponding channel receiving a channel control signal which has been deactivated is controlled to an activated state, and a corresponding channel receiving the channel control signal which has been activated is controlled to an deactivated state.

4. The semiconductor device according to claim 1, wherein the plurality of channels are configured to be selectively inputted the clock signal according to input times of test mode signals.

5. The semiconductor device according to claim 1, wherein any one of the plurality of channels is to be inputted the clock signal and remaining channels are not to be inputted the clock signal according to input times of test mode signals.

6. A semiconductor device, comprising:
   a plurality of channels;
   pad shared by the plurality of channels; and
   clock buffers respectively coupled to the plurality of channels one by one, and connected to the pad in common;
   wherein, the clock buffers are configured to be selectively inputted a clock signal in response to test mode signals for a test operation in a Direct Access mode for simultaneously testing the plurality of channels using the pad.

7. The semiconductor device according to claim 6, wherein a corresponding channel receiving a channel control signal which has been deactivated is controlled to an activated state, and a corresponding channel receiving the channel control signal which has been activated is controlled to an deactivated state.

8. The semiconductor device according to claim 6, wherein the clock buffers are configured to be selectively inputted the clock signal according to input times of test mode signals.

9. The semiconductor device according to claim 6, wherein any one of the clock buffers is to be inputted the clock signal and remaining clock buffers are not to be inputted the clock signal according to input times of test mode signals.

* * * * *